(12) United States Patent
Chien

(10) Patent No.: US 6,226,186 B1
(45) Date of Patent: May 1, 2001

(54) FASTENER FOR CPU RADIATING MODULE

(75) Inventor: Chang-fa Chien, Taipei (TW)

(73) Assignee: Ya-Wen Yang, Taipei (TW)

(*) Notice: Subject to any disclaimer, the term of this patent is extended or adjusted under 35 U.S.C. 154(b) by 0 days.

(21) Appl. No.: 09/515,391

(22) Filed: Feb. 29, 2000

(51) Int. Cl.⁷ .................................................. H05K 7/20
(52) U.S. Cl. .............................. 361/704; 24/625; 257/719
(58) Field of Search .................................. 267/150, 158, 267/160; 24/295, 297, 453, 497, 458, 625; 257/718, 719, 727; 361/687, 703, 704, 709, 710, 717–719; 174/16.3; 165/80.3, 185

(56) References Cited

U.S. PATENT DOCUMENTS

| | | | |
|---|---|---|---|
| 5,873,406 | * | 2/1999 | Horng . |
| 5,933,325 | * | 8/1999 | Hou . |
| 6,071,128 | * | 6/2000 | Brewington . |
| 6,108,207 | * | 8/2000 | Lee . |
| 6,111,752 | * | 8/2000 | Huang . |

OTHER PUBLICATIONS

Spring–Clip—Sink, IBM Tech Disc Bull vol. 23 No 12 May 1981, pD 5303, Almquist.*

* cited by examiner

Primary Examiner—Gerald Tolin
(74) Attorney, Agent, or Firm—Dougherty & Troxell

(57) ABSTRACT

A fastener for a CPU radiating module is provided. The fastener is integrally formed and mainly includes a pressing part. The pressing part is substantially V-shaped to give two ends thereof some extent of elasticity. A raised portion is provided at a top central area of the pressing part to prevent the pressing part from quick elastic fatigue. A first end of the pressing part extends outward to form an anti-skid handle and a control part. A top portion of the control part is bound by two downward bent lugs of the pressing part to closely locate below and in front of the handle. A second end of the pressing part is bent downward to form a tail. The control part and the bent tail could be elastically engaged with catches on a CPU seat that is a bottom component of the CPU radiating module, so that the V-shaped central portion of the pressing part is firmly held downward to tightly press a fin radiator against a CPU above the CPU seat, enabling the heat produced by the CPU to be fully transferred to and quickly radiated from the fin radiator.

2 Claims, 3 Drawing Sheets

FASTENER FOR CPU RADIATING MODULE

FILED OF THE INVENTION

The present invention relates to a fastener for CPU radiating module, and more particularly to an integrally formed fastener for CPU radiating module that includes pressing part and control part having enhanced strength to resist against quick elastic fatigue and has a handle portion provided with anti-skid serrated surface for an operator to manipulate the fastener more stably.

DESCRIPTION OF THE PRIOR ART

A CPU radiating module, as shown in FIG. 3, usually includes a CPU 5, a CPU seat 6 to a top of which the CPU 5 is connected, and a fin radiator 4 attached to a top of the CPU 5. The CPU 5 produces a large amount of heat during its operation. To effectively absorb and then radiate the heat produced by the CPU 5, the fin radiator 4 above the CPU 5 usually includes a plurality of fins in order to increase a contact area of the fin radiator 4 with the air and must be firmly attached to the CPU 5 by means of a fastener. To allow the fastener to firmly hold the fin radiator 4 and the CPU 5 and the CPU seat 6 together, the CPU seat 6 is provided at a first end and a second end with first and second catches 61, 62, respectively, for engaging with two ends of the fastener. FIGS. 1 and 2 illustrate two conventional fasteners 1 and 2 for firmly holding the fin radiator 4 to the CPU 5 and the CPU seat 6, so that they together form an integral unit with high heat-radiating efficiency.

The conventional fastener 1 for a CPU radiating module as shown in FIG. 1 mainly includes a pressing plate 11 and a control plate 12 connected to a first end of the pressing plate 1. The pressing plate 11 has an elongated body and is slightly downward bent near a middle point thereof. The pressing plate 11 is provided at a second end opposite to the first end with a downward bent tail 111 on which a second retaining hole 112 is provided for engaging with the second catch 62 on the CPU seat 6. The first end of the pressing plate 11 is in the form of a U-shaped head 122 to which the control plate 12 is connected. A free end of the control plate 12 provides a hook-shaped handle 120. The U-shaped head 122 has a first retaining hole 121 formed thereat for engaging with the first catch 61 on the CPU seat 6. By pushing down the handle 120, an operator controls the engagement or release of the first retaining hole 121 with or from the first catch 61 on the CPU seat 6 to press or loosen the fin radiator 4 against or from the CPU 5.

The conventional fastener 1 for the CPU radiating module is uneasy to manufacture. And, an overall length of the pressing plate 11 and the control plate 12 tends to change when an external force is applied on the fastener 1 and therefore prevents the fin radiator 4 from always firmly and closely contacting with the CPU 5. Moreover, the fastener 1, due to its shape, is subject to quick elastic fatigue and provides only pretty weak binding force and therefore causes the fin radiator 4 and the CPU 5 of the CPU radiating module to easily loosely move relative to one another. All these conditions result in a clearance between the fin radiator 4 and the CPU 5 to largely reduce the radiating efficiency of the fin radiator 4 and accordingly shorten the life of the CPU 5. Furthermore, it is not easy to apply a force on the hook-shaped handle 120 to stably manipulate the control plate 12.

The conventional fastener 2 for a CPU radiating module as shown in FIG. 2 mainly includes a pressing plate 21 and a control plate 24 connected to a first end of the pressing plate 21. The pressing plate 21 has an elongated body and is slightly downward bent near a middle part thereof. The pressing plate 21 is provided at a second end opposite to the first end with a downward bent tail 211 on which a second retaining hole 212 is provided for engaging with the second catch 62 on the CPU seat 6. The first end of the pressing plate 21 is provided with a hole 22 from where the first end is outward split into two arms 23 that may be elastically separated from one another by some extent in order to clamp the control plate 24 therebetween. The control plate 24 is provided at a lower part with a first retaining hole 241 and at two lateral sides with a notch 242 each. By positioning the control plate 24 between the two arms 23 with inner edges of the arms 23 engaging into the notches 242, the control plate 24 is fixedly connected to the first end of the pressing plate 21. An upper part of the control plate 24 is bent backward toward the second of the pressing plate 21 to provide a handle 240.

The conventional fastener 2 for the CPU radiating module is also uneasy to manufacture. The pressing plate 21 and the two arms 23 thereof is subject to quick elastic fatigue, and the control plate 24 tends to move between or even separate from the arms 23 when an external force is applied on the control plate 24, preventing the pressing plate 21 from being firmly depressed down to effectively hold the fin radiator 4, the CPU 5 and the CPU seat 6 together. That is, there would be a clearance existing between the fin radiator 4 and the CPU 5 to largely reduce the radiating efficiency of the fin radiator 4 and accordingly shorten the life of the CPU 5. Furthermore, it is not easy to apply a force on the backward bent handle 240 to stably manipulate the control plate 24.

Therefore, it is desirable to develop an improved fastener for a CPU radiating module to eliminate the drawbacks existing in the conventional fasteners for such purpose and to increase the radiating efficiency of the fin radiator 4 to prolong the life of CPU 5.

SUMMARY OF THE INVENTION

A primary object of the present invention is to provide a fastener for CPU radiating module that can be easily manufactured at reduced labor cost and time.

Another object of the present invention is to provide a fastener for CPU radiating module that can be conveniently and stably manipulated via a partially serrated handle to firmly clamp the fin radiator and the CPU together to ensure the radiating efficiency of the fin radiator.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
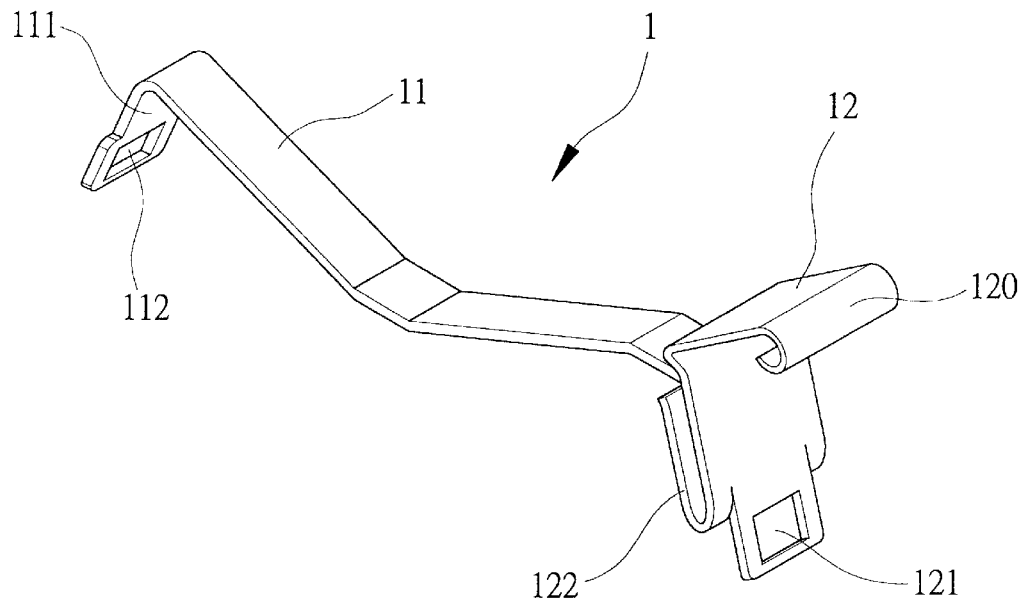
FIG. 1 is a perspective of a conventional fastener for a CPU radiating module.
Figure 2:
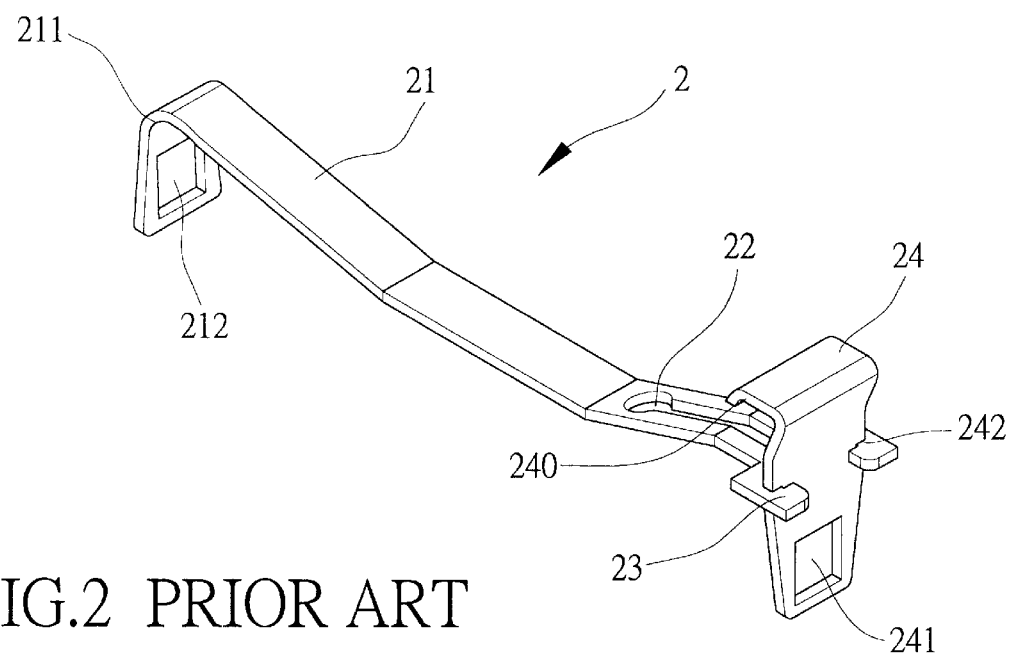
FIG. 2 is a perspective of another conventional fastener for a CPU radiating module.
Figure 3:
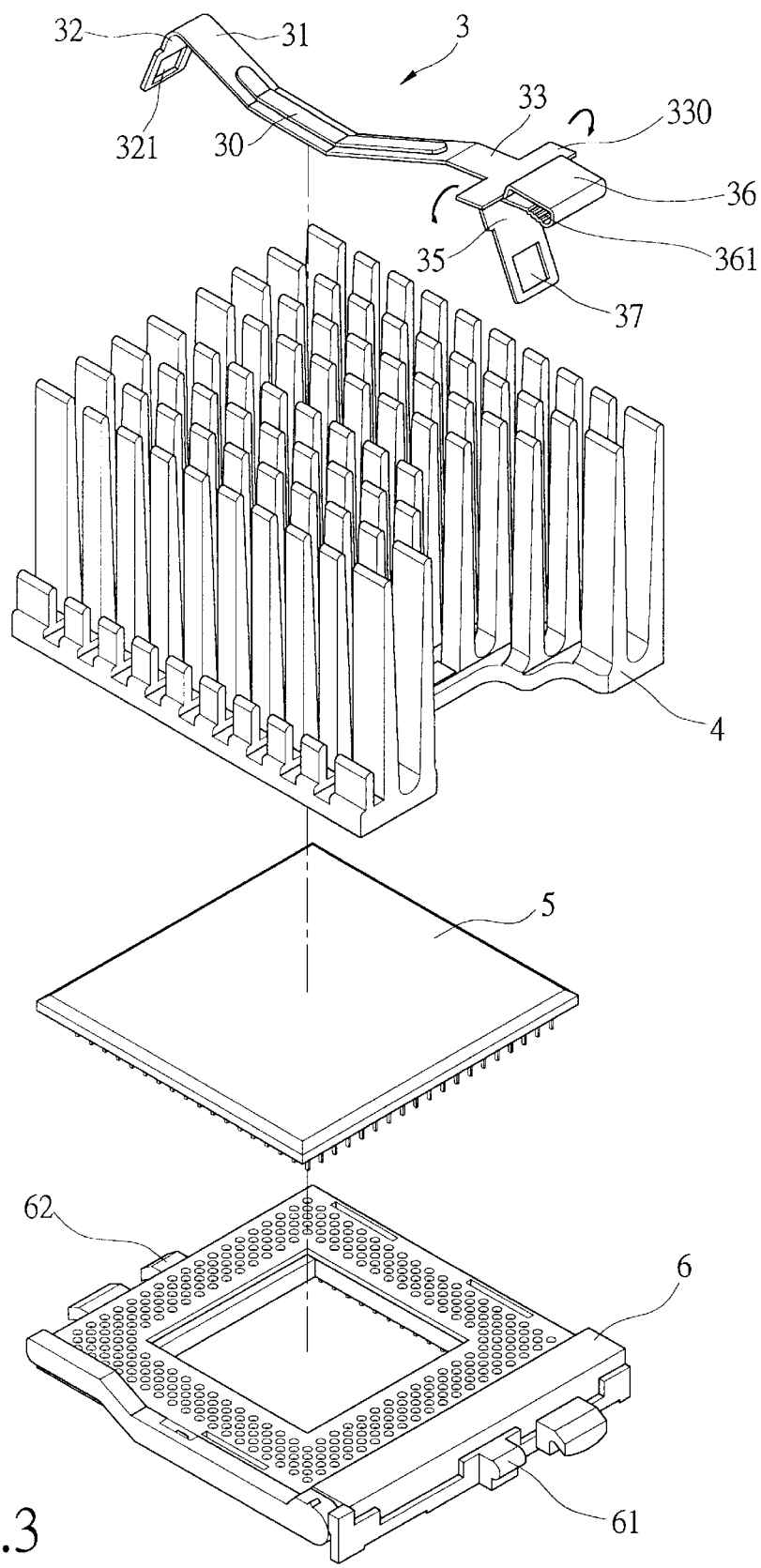
FIG. 3 is an exploded perspective of a CPU radiating module that includes a fin radiator, a CPU and a CPU seat that are held together by a fastener according to the present invention.
Figure 4:
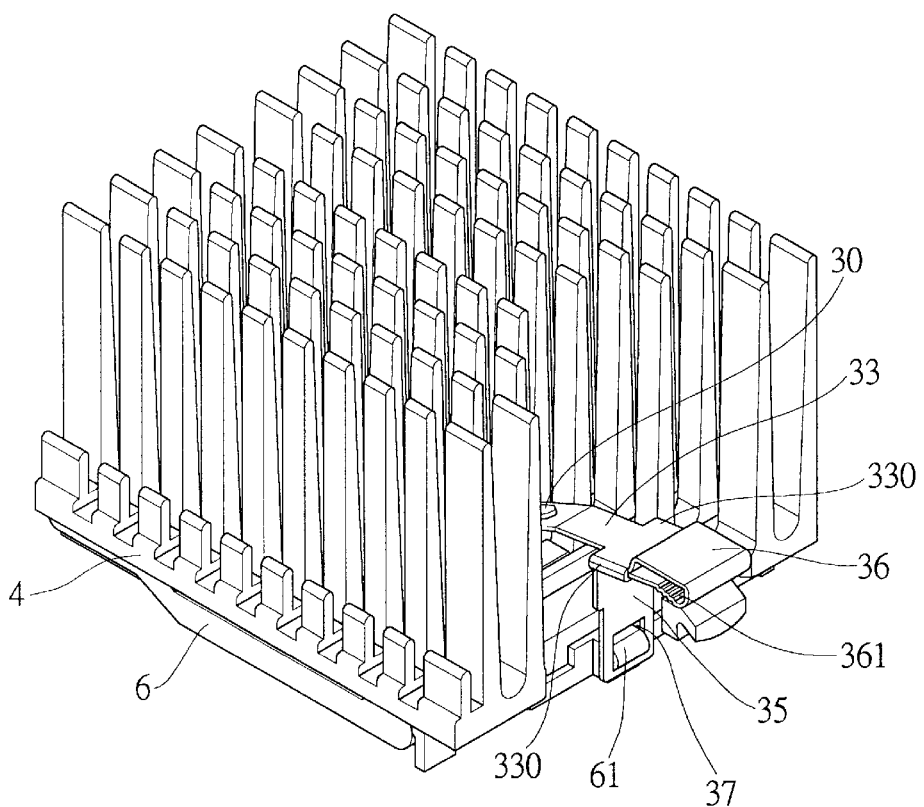
FIG. 4 is an assembled perspective of the CPU radiating module of FIG. 3 with the components thereof held together by the fastener of the present invention.

Please refer to FIGS. 3 and 4 that are exploded and assembled perspective views, respectively, of a CPU radiating module that uses a fastener 3 of the present invention to firmly hold components of the module, including a fin radiator 4, a CPU 5 and a CPU seat 6, to form a unitary body to ensure effective radiation of the large amount of heat produced by the CPU 5 during its operation. As mentioned earlier, to effectively absorb and then radiate the heat produced by the CPU 5, the fin radiator 4 above the CPU 5 usually includes a plurality of fins in order to increase a contact area of the fin radiator 4 with the air and must be firmly attached to the CPU by means of the fastener 3. To allow the fastener 3 to firmly hold the fin radiator 4 and the CPU 5 and the CPU seat 6 together, the CPU seat 6 is provided at a first end and a second end with first and second catches 61, 62, respectively, for engaging with two ends of the fastener 3.

The fastener 3 is an integrally formed one-piece member and includes a pressing part 31 having a first and a second end, and a control part 35 extended from the first end of the pressing part 31 and having a first retaining hole 37 provided thereon. The pressing part 31 is an elongated and substantially V-shaped plate with a slightly downward bent central portion, so that the two ends of the pressing part 31 are somewhat elastic relative to the bent central portion. The pressing part 31 has an underside that is a flat surface and a top surface that is provided along a central area with a raised portion 30. The raised portion 30 at the top surface of the pressing part 31 gives the pressing part 31 an enhanced strength to resist against quick elastic fatigue thereof. The second end of the pressing part 31 is downward bent to provide a tail 32 on which a second retaining hole 321 is formed for engaging with the second catch 62 provided on the second end of the CPU seat 6.

Figure 5:
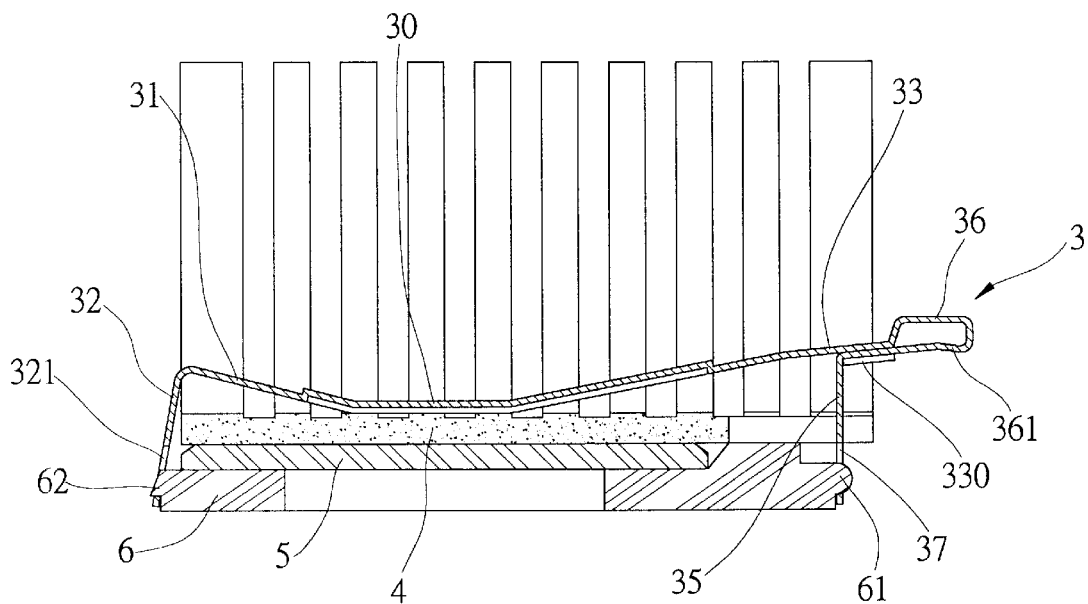
FIG. 5 is a sectional view showing the manner in which the fastener of the present invention holds the components of the CPU radiating module together.

Please refer to FIGS. 3, 4 and 5 at the same time. The first end of the pressing part 31 extends outward to first form a T-shaped head portion 33 having two sideward projected lugs 330. The pressing part 31 keeps extending outward from the T-shaped head 33 in such a manner that a substantially rectangular loop of a certain height is formed at outer side of the T-shaped head 33 with a top of the loop higher than the top surface of the rest portion of the pressing part 31. The loop forms a handle 36 at where an operator conveniently manipulates the fastener 3 with fingers. For the operator's fingers to stably and effortlessly contact with the handle 36 without easily skidding off the handle 36, a bottom surface of the handle 36 is provided with some teeth 361 to form a partially serrated surface. As can be clearly seen from FIG. 5, the pressing part 31 keeps extending from the loop-shaped handle 36 in a direction toward the second end thereof, so that the pressing part 31 extends below and beyond the two lugs 330 of the T-shaped head 33 before it turns downward to provide the control part 35 of the fastener 3. The two lugs 330 could be bent downward as indicated by the arrows at two sides of the two lugs 330 shown in FIG. 3, so as to firmly wrap and clamp most areas of two sides of a top of the control part 35 between the T-shaped head 33 and the bent lugs 330. The T-shaped head 33 and the top of the control part 35 are firmly bound together by the bent lugs 330 and therefore form a strong and united body.

FIG. 5 is a sectional view of the assembled CPU radiating module of FIG. 4 showing the actual manner in which the fastener 3 firmly binds the fin radiator 4, the CPU 5 and the CPU seat 6 together. As can be clearly seen from the drawing, the first end of the pressing part 31 is connected to the CPU seat 6 by engaging the first retaining hole 37 on the control part 35 with the first catch 61 at the first end of the CPU seat 6, and the second of the pressing part 31 is connected to the CPU seat 6 by engaging the second retaining hole 321 on the downward bent tail 32 with the second catch 62 at the second end of the CPU seat 6. After the two ends of the pressing part 31 are engaged with the catches 61, 62 of the CPU seat 6, the flat underside of the central portion of the pressing part 31 firmly presses the fin radiator 4 against the top of the CPU 5. The integrally formed raised central area 30 on the pressing part 31 prevents the substantially V-shaped fastener 3 from quick elastic fatigue and accordingly permits the same to firmly press the fin radiator 4 against the CPU 5 for a prolonged time while the control part 35 and the tail 32 are firmly engaged with the catches 61, 62, respectively.

When the fin radiator 4 is firmly pressed by the fastener 3 against the top of the CPU 5, no clearance will exist between the fin radiator 4 and the CPU 5. Therefore, all the heat produced by the CPU 5 during the operation thereof could be effectively transferred to and absorbed by the fin radiator 4 and finally be quickly radiated into the ambient air. That is, the fastener 3 enables the CPU radiating module to radiate heat at a high efficiency.

The handle 36 provided with the fastener 3 is in the form of a rectangular loop that has a raised flat top and a serrated bottom and could therefore be easily and stably held with fingers. Accordingly, when the operator's fingers apply a force on the handle 36 to manipulate the fastener 3, they would not easily skid off the handle 36 to cause undesired separation of the fin radiator 4 from the CPU 5. The top portion of the control part 35 being wrapped and clamped between the head 33 and the lugs 330 forms a strong supporting point that allows a firm depression of the handle 36 to facilitate accurate engagement or release of the first retaining hole 37 on the control part 35 with or from the first catch 61 of the CPU seat 6 for mounting or dismounting purpose. And, when the control part 35 is released from the first catch 61 on the CPU seat 6, the first end of the pressing part 31 automatically springs upward to allow easy disengagement of the second end of the pressing part 31 from the second catch 62 of the CPU seat 6.

What is claimed is:

1. A fastener for CPU radiating module, said CPU radiating module including from top to bottom a fin radiator, a CPU, and a CPU seat to which said CPU is connected; said fastener being used to bind said fin radiator, said CPU and said CPU seat of said CPU radiating module into a firmly associated unitary body; said fastener being an integrally formed one-piece body and comprising an elongated pressing part and a control part; said pressing part being substantially V-shaped and having a downward bent central portion to give two ends thereof some extent of elasticity, a top of said downward bent central portion of said pressing part being partially provided with a raised area that gives said pressing part an enhanced strength to resist against quick elastic fatigue thereof, a first end of said pressing part extending outward to first form a T-shaped head portion having two sideward projected lugs and then further extending outward from said T-shaped head in such a manner that a handle in the form of a substantially rectangular loop is formed at outer side of said T-shaped head for an operator to conveniently manipulate said fastener with fingers at said handle, the first end of said pressing part keeping extended from said loop-shaped handle backward to pass below and beyond said two lugs of said T-shaped head before turning downward to provide said control part; a top portion of said control part located below said T-shaped head being tightly bound to said T-shaped head by bending said two lugs downward to clamp two sides of said top portion of said control part, and a lower portion of said control part being provided with a first retaining hole for elastically engaging with a first catch provided on said CPU seat; and a second end of said pressing part being bent downward to form a tail on which a second retaining hole is formed for elastically engaging with a second catch on said CPU seat.

2. A fastener for CPU radiating module as claimed in claim 1, wherein said loop-shaped handle has a bottom surface on which a plurality of teeth are provided to form a partially serrated surface that prevents an operator's fingers from easily skidding off said handle.

\* \* \* \* \*